United States Patent
Koseki et al.

(10) Patent No.: US 9,024,348 B2
(45) Date of Patent: May 5, 2015

(54) LIGHT-EMITTING DEVICE INCLUDING LED CHIP AND A CASE HAVING RESIN AND GLASS FIBER

(71) Applicant: Toyoda Gosei Co., Ltd., Kiyosu-shi (JP)

(72) Inventors: Masakata Koseki, Kiyosu (JP); Makoto Sato, Kiyosu (JP)

(73) Assignee: Toyoda Gosei Co., Ltd., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 13/921,050

(22) Filed: Jun. 18, 2013

(65) Prior Publication Data

US 2014/0014993 A1    Jan. 16, 2014

(30) Foreign Application Priority Data

Jul. 12, 2012   (JP) .................................. 2012-156798

(51) Int. Cl.
*H01L 29/227* (2006.01)
*H01L 33/56* (2010.01)
*H01L 33/48* (2010.01)
*H01L 33/60* (2010.01)

(52) U.S. Cl.
CPC .............. *H01L 33/56* (2013.01); *H01L 33/486* (2013.01); *H01L 33/60* (2013.01); *H01L 2924/0002* (2013.01)

(58) Field of Classification Search
USPC ..................... 257/98–100, E33.055–E33.059
See application file for complete search history.

(56) References Cited

U.S. PATENT DOCUMENTS

| | | | |
|---|---|---|---|
| 5,733,659 A | 3/1998 | Iwakiri et al. | |
| 2011/0248304 A1* | 10/2011 | Ichikawa | ......................... 257/98 |
| 2013/0122272 A1* | 5/2013 | Kim | ............................. 428/220 |

FOREIGN PATENT DOCUMENTS

| EP | 0 812 882 A1 | 12/1997 |
|---|---|---|
| JP | 08-229980 A | 9/1996 |
| JP | 09-235419 A | 9/1997 |
| JP | 2004-071675 A | 3/2004 |
| JP | 2010-100682 A | 5/2010 |
| JP | 2011-057867 A | 3/2011 |

* cited by examiner

*Primary Examiner* — Matthew E Warren
(74) *Attorney, Agent, or Firm* — McGinn IP Law Group, PLLC

(57) ABSTRACT

A light-emitting device includes an LED chip, and a case including a sidewall portion that surrounds the LED chip so as to reflect a light emitted from the LED chip. The case further includes a resin that includes a glass fiber and is integrally formed by injection molding. An average length of the glass fiber is greater than a thickness of the sidewall portion. The resin has a refractive index different from the glass fiber.

17 Claims, 3 Drawing Sheets

LIGHT-EMITTING DEVICE INCLUDING LED CHIP AND A CASE HAVING RESIN AND GLASS FIBER

The present application is based on Japanese patent application No. 2012-156798 filed on Jul. 12, 2012, the entire contents of which are incorporated herein by reference.

BACKGROUND OF THE INVENTION

1. Field of the Invention

The invention relates to a light-emitting device.

2. Related Art

A light-emitting device is known that is provided with a reflector formed of a heat-dissipating resin composition containing glass fibers (see, e.g., JP-A-2010-100682).

JP-A-2010-100682 discloses that the rigidity of a molded object obtained is even greater if the average length of residual glass fibers contained in the molded object using the heat-dissipating resin composition is within a predetermined range.

SUMMARY OF THE INVENTION

It is an object of the invention to provide a light-emitting device that may offer an excellent light extraction efficiency by being equipped with a case that is formed of a resin containing glass fibers so as to exhibit a low optical absorptance.

(1) According to one embodiment of the invention, a light-emitting device comprises:

an LED chip; and a case comprising a sidewall portion that surrounds the LED chip so as to reflect a light emitted from the LED chip, wherein the case further comprises a resin that comprises a glass fiber and is integrally formed by injection molding, wherein an average length of the glass fiber is greater than a thickness of the sidewall portion, and wherein the resin has a refractive index different from the glass fiber.

In the above embodiment (1) of the invention, the following modifications and changes can be made.

(i) The thickness of the sidewall portion is not less than 65 μm and not more than 105 μm, and the average length of the glass fiber is not less than 230 μm and not more than a short side of the case in a top view.

(ii) The light-emitting device further comprising a side-view type light-emitting device.

(iii) The resin comprises one of a polyphthalamide resin, LCP, PCT, a silicone-based resin and an epoxy-based resin, and the glass fiber has a refractive index less than 1.45.

(iv) The resin comprises a fluorine resin, and the glass fiber has a refractive index more than 1.4.

(v) The light-emitting device further comprising a sealing material to seal the LED chip, wherein an upper surface of the sealing material substantially corresponds to a top of the sidewall portion.

Points of the Invention

According to one embodiment of the invention, a light-emitting device is constructed such that the glass fiber mixed with the resin in the case functions as not only a reinforcing material of the case but also a light reflecting material. Thus, the glass fiber reflects a light emitted from the LED chip such that it suppresses the light absorption of the resin. Thereby, the light-emitting device can be improved in light extraction efficiency.

BRIEF DESCRIPTION OF THE DRAWINGS

Next, the present invention will be explained in more detail in conjunction with appended drawings, wherein.

DESCRIPTION OF THE PREFERRED EMBODIMENTS

Embodiment

Structure of Light-Emitting Device

Figure 1A:
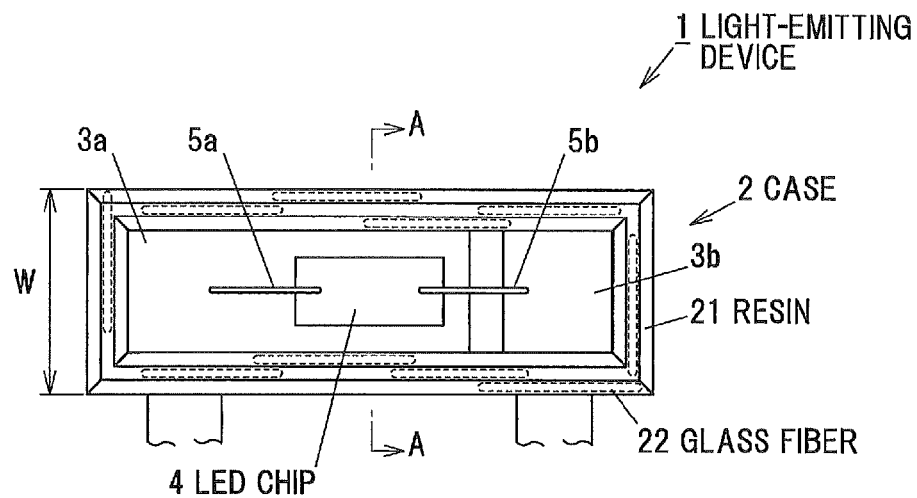
FIGS. 1A and 1B are respectively a top view and a side view showing a light-emitting device in an embodiment and FIG. 1C is a vertical cross-sectional view of the light-emitting device in the embodiment taken on line A-A of FIG. 1A.
Figure 1B:
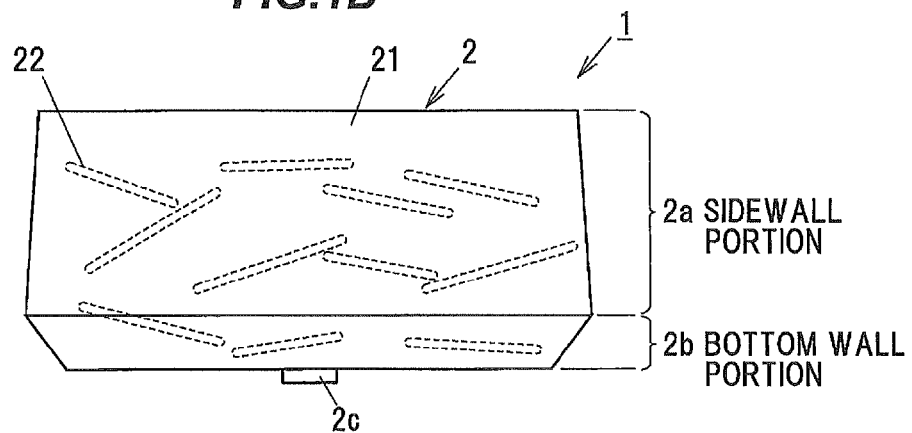
Figure 1C:
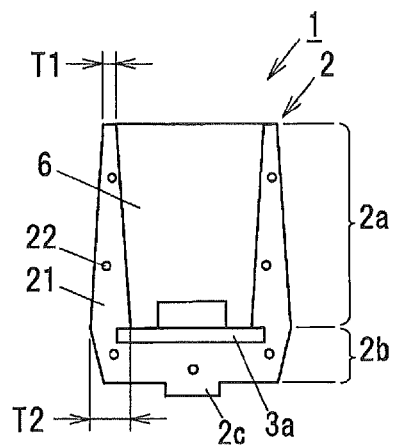

FIGS. 1A and 1B are respectively a top view and a side view showing a light-emitting device in the embodiment. FIG. 1C is a vertical cross-sectional view of the light-emitting device in the embodiment taken on line A-A of FIG. 1A.

A light-emitting device 1 has an LED chip 4 mounted on a lead frame 3 (3a and 3b) and a sealing material 6 for sealing the LED chip 4. The lead frame 3, the LED chip 4 and the sealing material 6 are formed in a case 2. Note that, an illustration of the sealing material 6 is omitted in FIG. 1A.

The case 2 has a sidewall portion 2a surrounding the LED chip 4 to reflect light emitted from the LED chip 4 and a bottom wall portion 2b under the lead frame 3. In addition, the case 2 has a gate portion 2c which is an impression of a gate of a mold used for injection molding, as described later. A resin 21 containing glass fiber 22 is injection-molded, thereby obtaining the case 2 in which the sidewall portion 2a, the bottom wall portion 2b and the gate portion 2c are integrally molded.

The resin 21 constituting the case 2 is, e.g., a thermoplastic resin such as polyphthalamide resin, LCP (Liquid Crystal Polymer) or PCT (Polycyclohexylene Dimethylene Terephalate), etc., or a thermosetting resin such as silicone resin, modified silicone resin, epoxy resin or modified epoxy resin, etc.

The sidewall portion 2a has, e.g., a shape with a thickness decreasing from the bottom to the top as shown in FIG. 1C so as to facilitate removal from the mold at the time of molding the case 2. In FIG. 1C, a thickness of the thinnest portion at the top is denoted by T1 and a thickness of the thickest portion at the bottom is denoted by T2. T1 is, e.g., 65 μm and T2 is, e.g., 105 μm. When the thickness of the sidewall portion 2a is smaller than 65 μm, damages may be caused due to lack of strength. Meanwhile, when greater than 105 μm, a lateral width W of the case 2 may become a value which causes difficulty in using the light-emitting device 1 as a below-described thin light-emitting device of side-view type, etc. In this regard, however, the shape of the sidewall portion 2a is not limited thereto and may have, e.g., a uniform thickness (T1=T2).

The glass fiber 22 contained in the case 2 functions not only as a reinforcing material of the case 2 but also as a light reflective material. The glass fiber 22 reflects light emitted from the LED chip 4 and this suppresses light absorption by the resin, which allows light extraction efficiency of the light-emitting device 1 to be improved.

The glass fiber 22 has a columnar shape with a diameter of not less than 6 μm and not more than 13 μm. The content of the glass fiber 22 in the case 2 is, e.g., not less than 1 mass % and not more than 40 mass %.

A refractive index of the resin 21 is different from that of the glass fiber 22 so that light is efficiently reflected at an interface between the glass fiber 22 and the resin 21. When the resin 21 is, e.g., a polyphthalamide resin, LCP, PCT, a silicone-based resin or an epoxy-based resin, the refractive index of the resin 21 is not less than 1.45 and it is therefore preferable that the refractive index of the glass fiber 22 be less than 1.45. On the other hand, when the resin 21 is, e.g., a fluorine resin, the refractive index of the resin 21 is not more than 1.4 and it is therefore preferable that the refractive index of the glass fiber 22 be greater than 1.4.

An average length of the glass fibers 22 is greater than the thickness of the sidewall portion 2a. In other words, the average length of the glass fibers 22 is greater than the thickness T2 of the thickest portion of the sidewall portion 2a. Accordingly, the glass fibers 22 are arranged at an angle nearly parallel to the surface direction of the sidewall portion 2a and it is thereby possible to reflect light more effectively.

Meanwhile, it is considered that light emitted from the LED chip 4 and entering the case 2 propagates in the glass fiber 22 and is then extracted from an inner surface of the sidewall portion 2a. Therefore, light is more likely to propagate in the case 2 and to be extracted from the inner surface of the sidewall portion 2a when the glass fiber 22 is longer.

It is preferable that the average length of the glass fibers 22 is not less than 230 μm. Not less than 230 μm of the average length of the glass fiber 22 allows light absorptance of the case 2 to be sufficiently suppressed even when the sidewall portion 2a has a relatively small thickness of not less than 65 μm and not more than 105 μm.

The case 2 is often required to have a small lateral width W especially when the light-emitting device 1 is thin as is a side-view type light-emitting device. In case of, e.g., a side-view type, the light-emitting device 1 is attached so that the bottom wall portion 2b of the case 2 is substantially perpendicular to a mounting surface of the light-emitting device 1. Therefore, a lateral direction of the case 2 is also a thickness direction of the light-emitting device 1, and accordingly, a thickness of the light-emitting device 1 is more reduced as the lateral width W of the case 2 is smaller. In such a case, in the present embodiment, it is possible to thin the sidewall portion 2a to reduce the lateral width W while suppressing light absorptance of the case 2 and it is thus possible to obtain a thin light-emitting device 1 having excellent light extraction efficiency.

Figure 2:
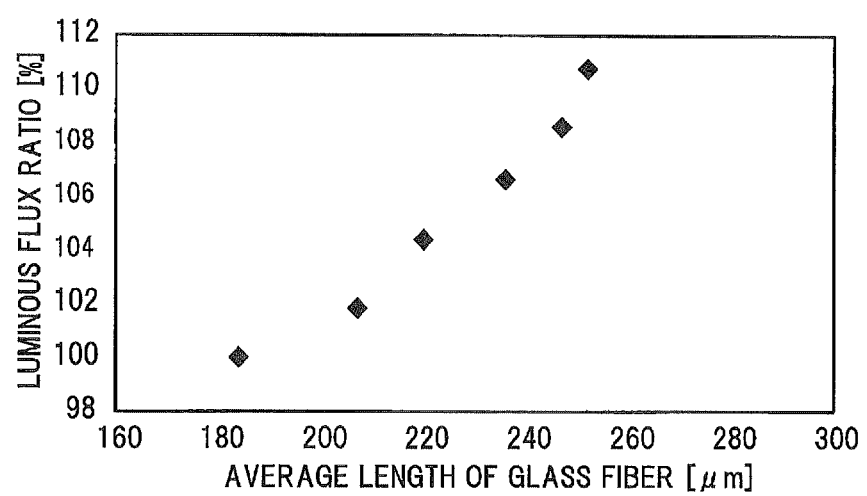
FIG. 2 is a graph showing a relation between an average length of glass fibers and a luminous flux of the light-emitting device.

FIG. 2 is a graph showing a relation between an average length of the glass fibers 22 and a luminous flux of the light-emitting device 1 when the sidewall portion 2a has a thickness of not less than 65 μm and not more than 105 μm, i.e., when the thickness T1 of the thinnest portion is 65 μm and the thickness T2 of the thickest portion is 105 μm. In FIG. 2, a horizontal axis indicates an average length (μm) of the glass fibers 22 and a vertical axis indicates a luminous flux ratio (%) where the luminous flux with the average length of the glass fibers 22 being 184 μm is defined as 100%.

FIG. 2 shows that, when the sidewall portion 2a has a thickness of not less than 65 μm and not more than 105 μm, the greater the average length of the glass fibers 22, the larger the luminous flux of the light-emitting device 1, i.e., the higher the light extraction efficiency of the light-emitting device 1.

A luminous flux ratio of the light-emitting device 1 is about 95% when the glass fibers 22 is not contained in the case 2. When the average length of the glass fiber 22 is not less than 230 μm, it is possible to improve luminous flux by 10% or more as compared to the case where the glass fiber 22 is not contained in the case 2. Therefore, the average length of the glass fibers 22 is preferably not less than 230 μm.

In the measurement in FIG. 2, the lateral width W of the case 2 was 600 μm and the length range of the glass fiber 22 was from 0 to 600 μm. The reason why the lateral width W of the case 2 coincides with the maximum length of the glass fiber 22 will be described later.

Manufacturing of Case

The case 2 is manufactured by injection molding. Firstly, a row material of the resin 21 and that of the glass fiber 22 are introduced into a resin extruder and the resin is melted by heat from a heater of a cylinder and frictional heat generated by rotation of a screw. After that, the molten resin 21 containing the raw material of the glass fiber 22 is pressurized by the screw, is discharged from a nozzle of the resin extruder and is injected into a mold.

The molten resin to be injected from the resin extruder into the mold passes through a sprue as a flow path, then passes through a runner as a branch and is then filled and molded in a space formed of cavity and core. Here, an entrance of the space formed of cavity and core is called a gate and the gate portion 2c of the case 2 is a portion of the resin 21 which is cured inside the gate. After that, the molded resin 21 containing the glass fiber 22 is removed from the mold, thereby obtaining the case 2.

By introducing the raw material of the glass fiber 22 into the resin extruder from a side feeder thereof, not from a breech-loading position, it is possible to reduce a force applied to the raw material of the glass fiber 22 in the cylinder and thus to suppress a decrease in the average length of the glass fiber 22. As a result, it is possible to form the glass fibers 22 with a long average length.

For example, when the average length of the glass fibers 22 obtained by introducing the raw material from the breech-loading position of the resin extruder is defined as 100%, the average length of the glass fibers 22 when introducing the raw material from the side feeder is 235%. As the raw material of the glass fiber 22, it is possible to use, e.g., chopped strands with a cut length of about 3 to 6 mm.

Figure 3:
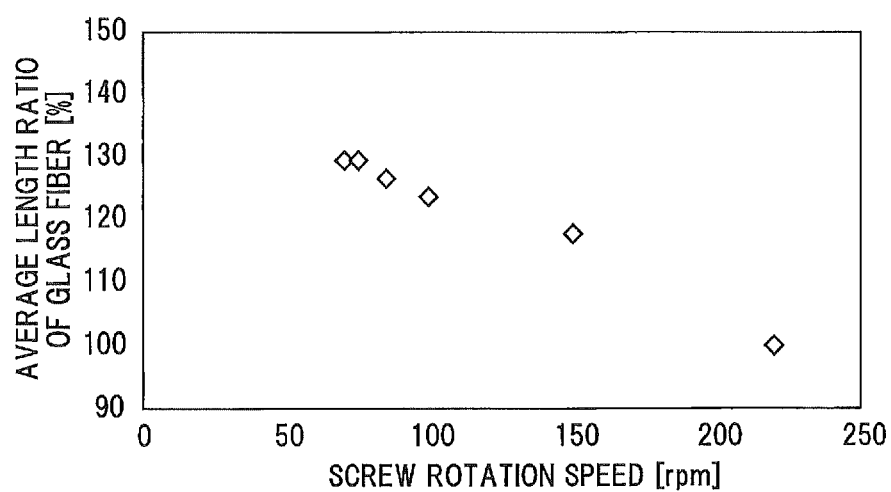
FIG. 3 is a graph showing an example of a relation between a screw rotation speed of a resin extruder and the average length of glass fibers.

In addition, by reducing the screw rotation speed of the resin extruder, it is possible to reduce the force applied to the raw material of the glass fiber and thus to suppress a decrease in the average length. FIG. 3 is a graph showing an example of a relation between a screw rotation speed and the average length of the glass fibers 22. In FIG. 3, a horizontal axis indicates a screw rotation speed (rpm) and a vertical axis indicates an average length ratio (%) of the glass fiber 22 where the average length of glass fibers 22 at a screw rotation speed of 220 rpm is defined as 100%. According to FIG. 3, the average length ratio of the glass fiber 22 is 129% when the screw rotation speed is 70 rpm and not more than 75 rpm.

In this regard, however, the average length of the glass fibers 22 is not more than the lateral width W of the case 2. This is because glass fiber having a length equal to or greater than the width W is often broken at the time of passing through the runner or the gate of the mold or is stuck without being able to pass therethrough in the process of injection molding and the maximum length of the glass fiber 22 substantially coincides with the width W.

As described above, by introducing the raw material of the glass fiber 22 from the side feeder of the resin extruder and reducing the screw rotation speed, it is possible to suppress a decrease in the average length of the glass fibers 22. In case that the case 2 having, e.g., the lateral width W of 600 μm and the sidewall portion 2a with the thickness T1 of 65 μm and the thickness T2 of 105 μm is formed, the glass fiber 22 with an average length of not less than 230 μm can be formed in the case 2.

In addition, it is preferable that fine particles functioning as a light reflective material be dispersed in the resin 21. The fine particle of the light reflective material is formed of, e.g., titanium oxide, zinc oxide, zirconium oxide, barium sulfate, zinc sulfide or boron nitride. In addition, it is preferable that the fine particle of the light reflective material has a substantially spherical shape with a diameter of not less than 0.1 μm and not more than 0.3 μm and be present in the case 2 at a content of not less than 10% and not more than 50%. When the resin 21 contains the fine particles of the light reflective material, light can be diffusely-reflected by the glass fiber 22 and specularly-reflected by the fine particles.

The lead frame 3 is formed of, e.g., Cu of which surface is plated with Ag.

Non-illustrated n- and p-electrodes of the LED chip 4 are respectively connected to the lead frames 3a and 3b via wires 5a and 5b (wire bonding). In addition, the LED chip 4 is fixed to the lead frame 3 by a die bonding paste.

The light-emitting device 1 shown in FIG. 1 is a top-view type surface mount device using a face-up type LED chip as the LED chip 4, but may alternatively have another configuration such as side view type, bullet type or COB (Chip on Board) type. In addition, the LED chip 4 is not limited to a face-up type and may be, e.g., a flip-chip type.

The sealing material 6 is formed of a silicone-based resin or an epoxy-based resin. The sealing material 6 may contain a phosphor. In addition, a dispersant for dispersing the phosphor may be contained therein. The phosphor may be contained in a dispersed state or in a settled state.

Effects of the Embodiment

In the present embodiment, the absorption of light emitted from the LED chip by the case can be effectively suppressed by appropriately setting a relation between the average length of the glass fibers contained in the case and the thickness of the sidewall portion of the case, thereby reducing light loss. Therefore, it is possible to improve light extraction efficiency of the light-emitting device.

In addition, since the absorption of light emitted from the LED chip by the case can be effectively suppressed even when the sidewall portion of the case is thin, it is possible to obtain a thin light-emitting device having excellent light extraction efficiency.

The present invention is not intended to be limited to the above-mentioned embodiment, and the various kinds of modifications can be implemented without departing from the gist of the invention.

In addition, the invention according to claims is not to be limited to the above-mentioned embodiment. Further, it should be noted that all combinations of the features described in the embodiment are not necessary to solve the problem of the invention.

What is claimed is:
1. A light-emitting device, comprising:
an LED chip; and
a case comprising a sidewall portion that surrounds the LED chip so as to reflect a light emitted from the LED chip,
wherein the case further comprises a resin that comprises a glass fiber and is integrally formed by injection molding,
wherein an average length of the glass fiber is greater than a thickness of the sidewall portion,
wherein the resin has a refractive index different from the glass fiber, and
wherein a ratio of the thickness of the sidewall portion to the average length of the glass fiber is in a range of 0.36 to 0.57.

2. The light-emitting device according to claim 1, wherein the thickness of the sidewall portion is not less than 65 μm and not more than 105 μm, and
wherein the average length of the glass fiber is not less than 230 μm and not more than a short side of the case in a top view.

3. The light-emitting device according to claim 1, further comprising a side-view type light-emitting device.

4. The light-emitting device according to claim 1, wherein the resin comprises one of a polyphthalamide resin, LCP, PCT, a silicone-based resin and an epoxy-based resin, and wherein the glass fiber has a refractive index less than 1.45.

5. The light-emitting device according to claim 1, wherein the resin comprises a fluorine resin, and
wherein the glass fiber has a refractive index more than 1.4.

6. The light-emitting device according to claim 1, further comprising:
a sealing material to seal the LED chip,
wherein an upper surface of the sealing material substantially corresponds to a top of the sidewall portion.

7. The light-emitting device according to claim 1, wherein the case further comprises:
a bottom wall portion disposed below the LED chip and the sidewall portion; and
a gate portion which is an impression of a gate of a mold used for injection molding,
wherein the sidewall portion, the bottom wall portion, and the gate portion integrally form the case.

8. The light-emitting device according to claim 1, wherein the sidewall portion has a thickness decreasing from a bottom to a top of the sidewall portion.

9. The light-emitting device according to claim 1, wherein the sidewall portion has a thickness which is uniform from a bottom to a top of the sidewall portion.

10. The light-emitting device according to claim 1, wherein the glass fiber has a columnar shape with a diameter not less than 6 μm and not more than 13 μm.

11. The light-emitting device according to claim 1, wherein a content of the glass fiber in the case is not less than 1 mass % and not more than 40 mass %.

12. The light-emitting device according to claim 7, wherein the bottom wall portion of the case is disposed so as to be substantially perpendicular to a mounting surface of the light-emitting device.

13. The light-emitting device according to claim 1, wherein a thickness of the sidewall portion is set in relation to a luminous flux of the light-emitting device such that the luminous flux of the light-emitting device is 95% or greater.

14. The light-emitting device according to claim 1, wherein the glass fiber is arranged at an angle substantially parallel to a surface direction of the sidewall portion.

15. The light-emitting device according to claim 1, wherein the average length of the glass fiber is greater than a thickest portion of the sidewall portion.

16. The light-emitting device according to claim 1, wherein the average length of the glass fibers is greater than the thickness of the sidewall portion thereby improving a light extraction efficiency of the device.

17. The light-emitting device according to claim 1, wherein injection molding introduces a raw material of the glass fiber into a resin extruder from a side feeder, in order to reduce a force applied to the raw material, thereby suppressing a decrease in the average length of the glass fiber.

* * * * *